United States Patent
Zhou et al.

(10) Patent No.: US 9,564,481 B2
(45) Date of Patent: Feb. 7, 2017

(54) FULLY-PRINTED CARBON NANOTUBE THIN FILM TRANSISTOR CIRCUITS FOR ORGANIC LIGHT EMITTING DIODE

(71) Applicants: Chongwu Zhou, San Marino, CA (US); Kosmas Galatsis, Torrance, CA (US); Pochiang Chen, Hillsboro, OR (US); Yue Fu, San Jose, CA (US)

(72) Inventors: Chongwu Zhou, San Marino, CA (US); Kosmas Galatsis, Torrance, CA (US); Pochiang Chen, Hillsboro, OR (US); Yue Fu, San Jose, CA (US)

(73) Assignees: ANEEVE LLC, Torrance, CA (US); The Regents of the University of California, Oakland, CA (US); The University of Southern California, Los Angeles, CA (US)

(*) Notice: Subject to any disclaimer, the term of this patent is extended or adjusted under 35 U.S.C. 154(b) by 0 days.

(21) Appl. No.: 14/438,927

(22) PCT Filed: Oct. 31, 2013

(86) PCT No.: PCT/US2013/067886
§ 371 (c)(1),
(2) Date: Apr. 28, 2015

(87) PCT Pub. No.: WO2014/116316
PCT Pub. Date: Jul. 31, 2014

(65) Prior Publication Data
US 2015/0279919 A1    Oct. 1, 2015

Related U.S. Application Data

(60) Provisional application No. 61/721,289, filed on Nov. 1, 2012.

(51) Int. Cl.
*H01L 29/08* (2006.01)
*H01L 27/32* (2006.01)
(Continued)

(52) U.S. Cl.
CPC ....... *H01L 27/3274* (2013.01); *H01L 51/0004* (2013.01); *H01L 51/0048* (2013.01);
(Continued)

(58) Field of Classification Search
CPC ............ H01L 27/3274; H01L 51/0004; H01L 51/0048; H01L 51/0096; H01L 51/052; H01L 51/0541; H01L 51/055; H01L 51/105
(Continued)

(56) References Cited

U.S. PATENT DOCUMENTS

2007/0138463 A1* 6/2007 Herlogsson et al. .................. H01L 51/0516 257/40
2007/0138479 A1* 6/2007 Yamazaki et al. ... G09G 3/2014 257/72
(Continued)

FOREIGN PATENT DOCUMENTS

WO    WO 2007126412 A2 * 11/2007 ............. B82Y 10/00

*Primary Examiner* — Matthew Gordon

(57) ABSTRACT

The subject technology relates to a method including steps for disposing a first electrically conductive material on a substrate to form a first layer of electrodes on the substrate, wherein the first layer includes a source electrode and a drain electrode, and printing a film including carbon nanotubes between the source electrode and the drain electrode, thereby defining at least a first interface between the carbon nanotube film and the source electrode and a second interface between the carbon nanotube film and drain electrode. In certain aspects, the method can further include steps for disposing a second electrically conductive material over the first interface between the carbon nanotube film and the
(Continued)

source electrode and the second interface between the carbon nanotube film and the drain electrode. In certain aspects, a transistor device is also provided.

17 Claims, 8 Drawing Sheets

(51) Int. Cl.
    *H01L 51/00*     (2006.01)
    *H01L 51/10*     (2006.01)
    *H01L 29/16*     (2006.01)
    *H01L 51/05*     (2006.01)

(52) U.S. Cl.
    CPC ........ *H01L 51/0096* (2013.01); *H01L 51/052* (2013.01); *H01L 51/055* (2013.01); *H01L 51/0541* (2013.01); *H01L 51/105* (2013.01); *H01L 29/1606* (2013.01); *H01L 51/0034* (2013.01); *H01L 51/0558* (2013.01)

(58) Field of Classification Search
    USPC .......................................................... 257/40
    See application file for complete search history.

(56) References Cited

U.S. PATENT DOCUMENTS

| | | | | |
|---|---|---|---|---|
| 2010/0032653 | A1* | 2/2010 | Takeda et al. | B82Y 10/00 257/24 |
| 2010/0140590 | A1* | 6/2010 | Blanchet et al. | B82Y 10/00 257/24 |
| 2010/0224862 | A1* | 9/2010 | Endoh et al. | B82Y 10/00 257/24 |
| 2011/0248243 | A1* | 10/2011 | Chen et al. | B82Y 10/00 257/29 |
| 2012/0187379 | A1* | 7/2012 | Wu et al. | C08K 3/04 257/40 |

* cited by examiner

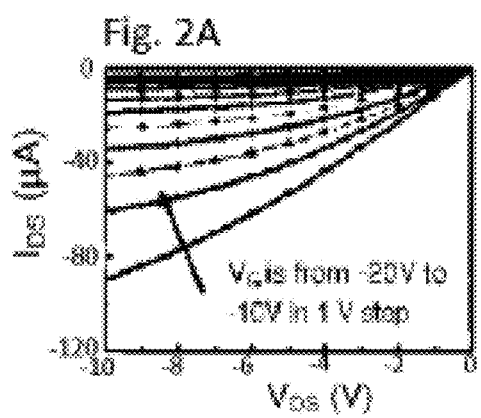
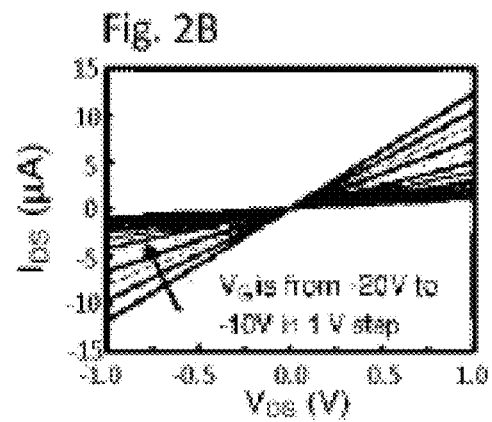
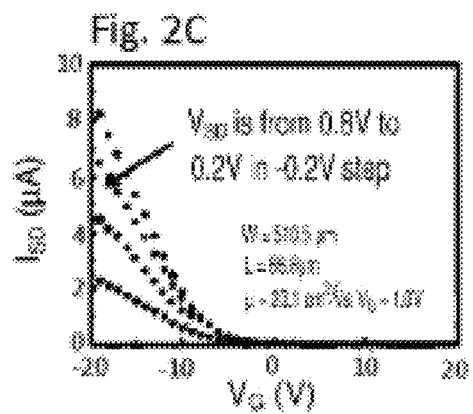
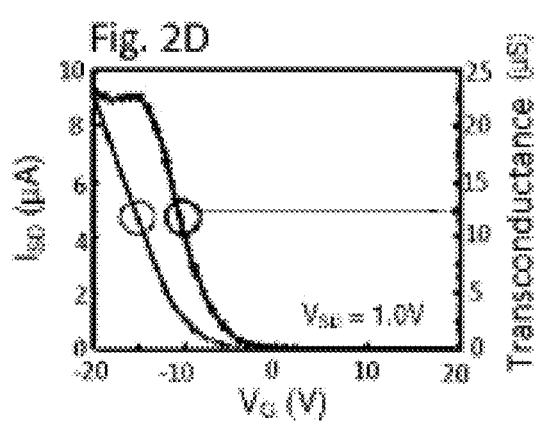
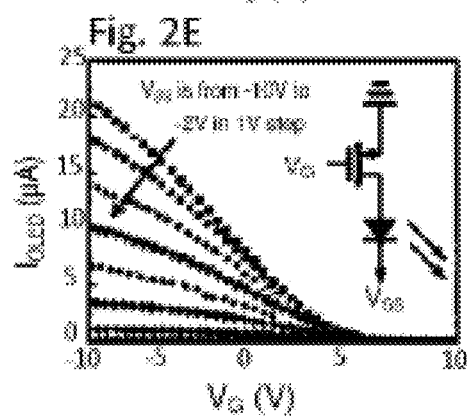
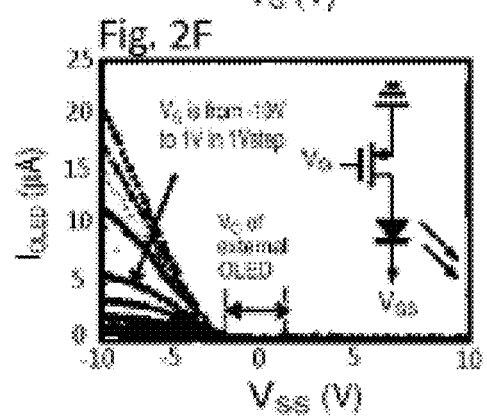

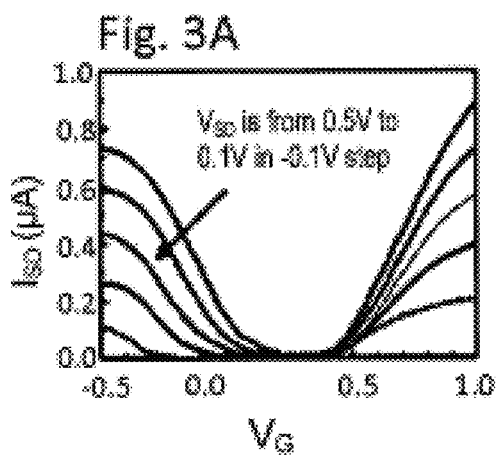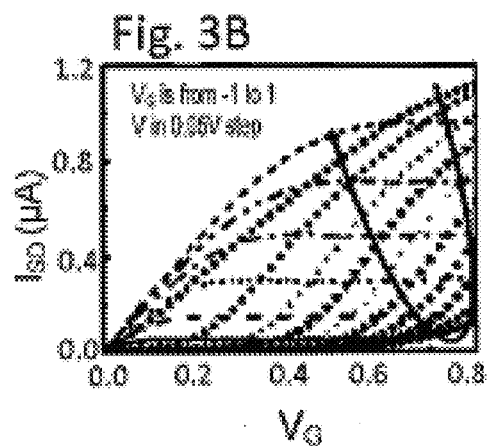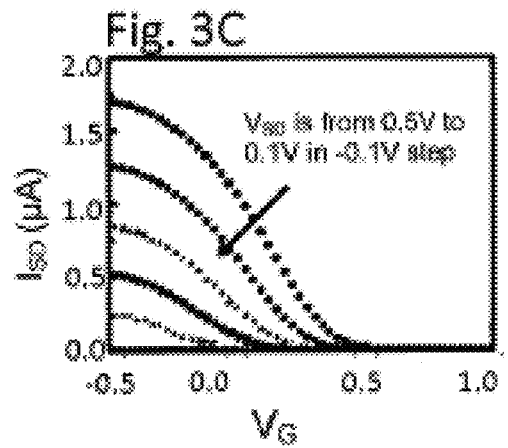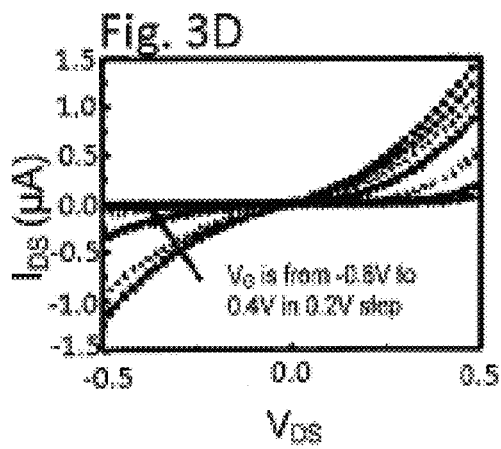

US 9,564,481 B2

FULLY-PRINTED CARBON NANOTUBE THIN FILM TRANSISTOR CIRCUITS FOR ORGANIC LIGHT EMITTING DIODE

STATEMENT OF GOVERNMENT INTEREST

This work was supported by the Defense Advanced Research Projects Agency under SBIR contract No. HR 0011-10-0-0003 and the Defense Threat Reduction Agency under contract No. HDTRA1-10-1-0015. The government has certain rights in the invention.

This application claims the benefit of U.S. Provisional Application No. 61/721,289, filed Nov. 1, 2012, and entitled "Fully-Printed Carbon Nanotube Thin Film Transistor Circuits for Organic Light Emitting Diode," which is Incorporated herein by reference.

TECHNICAL FIELD

The subject application relates to a method for printing carbon nanotube thin-film transistor circuits, and in particular for printing transistor circuits for use in driving organic light emitting diodes (OLEOs).

BACKGROUND

Compared to liquid crystal displays (LCDs) organic light emitting diodes (OLEOs) are low cost, light weight and provide flexible plastic substrate compatibility. Additionally, OLEOs can provide wider viewing angles, enhanced brightness, greater power efficiency and shorter response times.

SUMMARY

In some aspects, the subject technology relates to a method including steps for disposing a first electrically conductive material on a substrate to form a first layer of electrodes on the substrate, wherein the first layer of electrodes comprises a source electrode and a drain electrode, and printing a film comprising carbon nanotubes on the substrate between the source electrode and the drain electrode, thereby defining at least a first interface between the carbon nanotube film and the source electrode and a second interface between the carbon nanotube film and the drain electrode. In certain implementations, the method can further include steps for disposing a second electrically conductive material over the first interface between the carbon nanotube film and the source electrode and the second interface between the carbon nanotube film and the drain electrode, and disposing a dielectric material over exposed portions of the carbon nanotube film.

In yet another aspect, the subject technology relates to a transistor including a substrate, a first layer of electrodes formed on the substrate and comprising a source electrode and a drain electrode and a single-walled carbon nanotube film printed between the source electrode and the drain electrode and forming an interface between the carbon nanotube film and the source electrode and the carbon nanotube film and the drain electrode. In certain implementations, the transistor can further include a second layer of electrodes formed over the interface between the carbon nanotube film and the source electrode and the carbon nanotube film and the drain electrode, and a dielectric layer formed over the carbon nanotube film.

BRIEF DESCRIPTION OF THE DRAWINGS

Certain features of the subject technology are set forth in the appended claims. However, the accompanying drawings, which are included to provide further understanding, illustrate disclosed aspects and together with the description serve to explain the principles of the subject technology. In the drawings:

FIG. 2A illustrates examples of $I_{DS}$-$V_{DS}$ family curves showing saturation behavior, according to some aspects;

FIG. 2B illustrates examples of $I_{DS}$-$V_{DS}$ family curves showing linearity, according to some aspects;

FIG. 2C illustrates examples of $I_{SD}$-$V_G$ family curves, according to some aspects;

FIG. 2D illustrates an example $I_{SD}$-$V_G$ and corresponding gm-$V_G$ curve at $V_{SD}$=1.0 V, according to some aspects;

FIG. 2E illustrates examples of electric property measurements for back gated TFTs connected to an external OLEO, including $I_{OLED}$-$V_G$ family curves, and an example circuit diagram, according to some aspects of the technology;

FIG. 2F illustrates an example of $I_{OLED}$-$V_{SS}$ family curves, wherein the inset illustrates an example circuit diagram, according to some aspects of the technology;

FIGS. 3A and 3B conceptually illustrate examples of electric properties of top gated CNT TFTs on a Si/SiO$_2$ wafer with ambipolar behavior, including $I_{SD}$-$V_G$ family curves and $I_{DS}$-$V_{DS}$ family curves, according to some aspects of the technology;

FIG. 3C illustrates an example of electric properties for one top gated CNT TFT on a Si/SiO$_2$ wafer with p-type behavior, according to some aspects of the subject technology;

FIG. 3D illustrates an example of $I_{SD}$-$V_G$ family curves and $I_{DS}$-$V_{DS}$ family curves for the top gated CNT TFT of FIG. 4C, according to some aspects of the technology;

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a more thorough understanding of the subject technology. However, it will be clear and apparent that the subject technology is not limited to the specific details set forth herein and may be practiced without these specific details. In some instances, structures and components are shown in block diagram form in order to avoid obscuring the concepts of the subject technology.

Figures 1A, 1B:
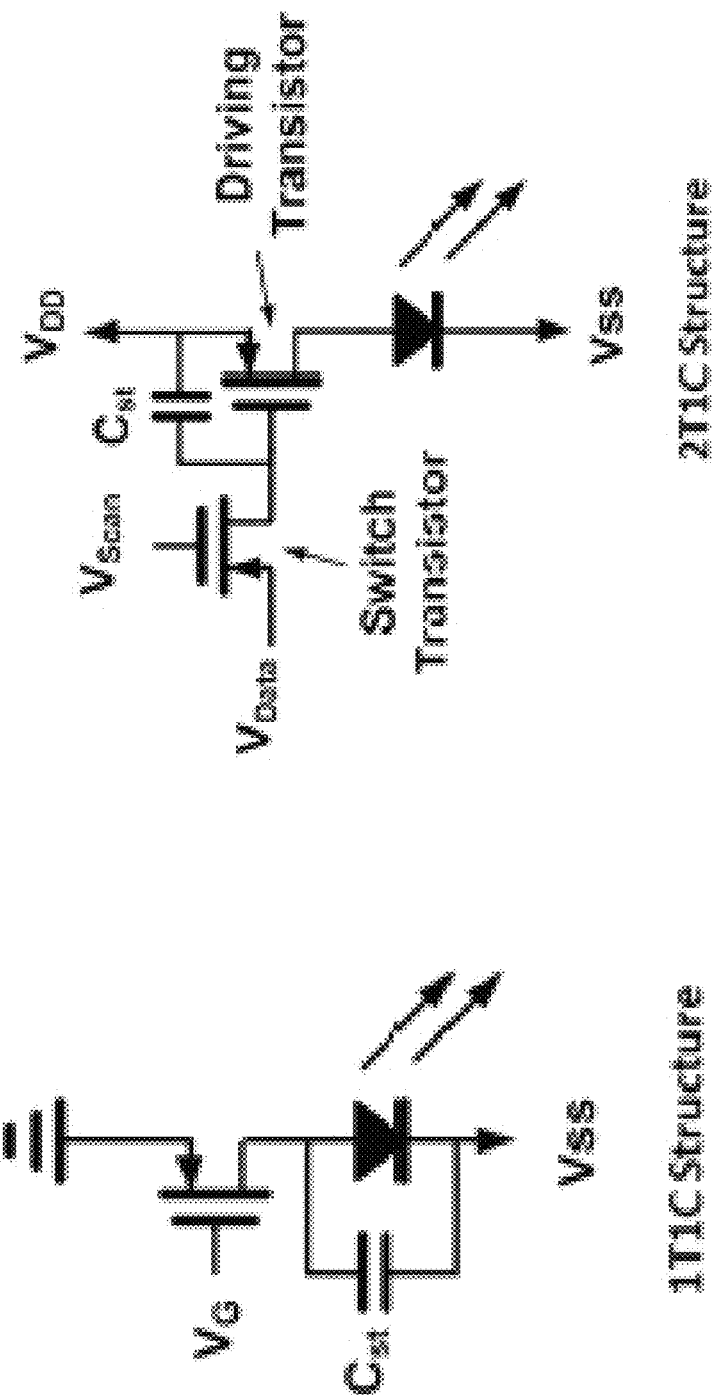
FIG. 1A depicts a schematic diagram of a 1T1C display control circuit.
FIG. 1B depicts a schematic diagram of a 2T1C display control circuit.

In certain aspects, circuits contain only one switch thin-film transistor (TFT) and one storage capacitor (1T1C), as illustrated in the example of FIG. 1A. A more complicated control circuit includes one switch transistor and one driving transistor besides a storage capacitor e.g., 2T1C in FIG. 1B. This structure allows a longer data storage time as compared to that of the 1T1C circuit. Other types of OLED driving circuits can require more transistors to achieve longer data storage time, more uniform luminance within one matrix of pixels and less impact from pixel differential aging problem and current state (whether pixel is lit on or turned off) readout port. However, such driving circuits are more complicated to realize.

Figure 1C:
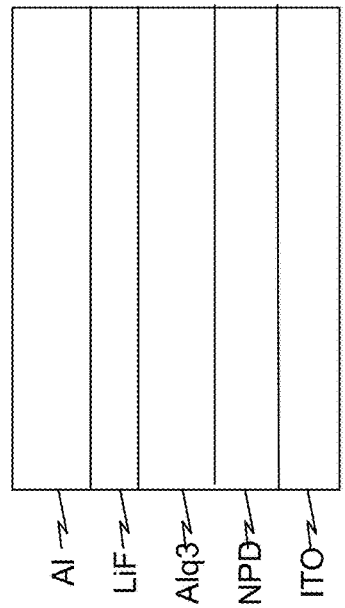
FIG. 1C depicts a cross-sectional schematic diagram of an OLED structure.
Figure 1D:
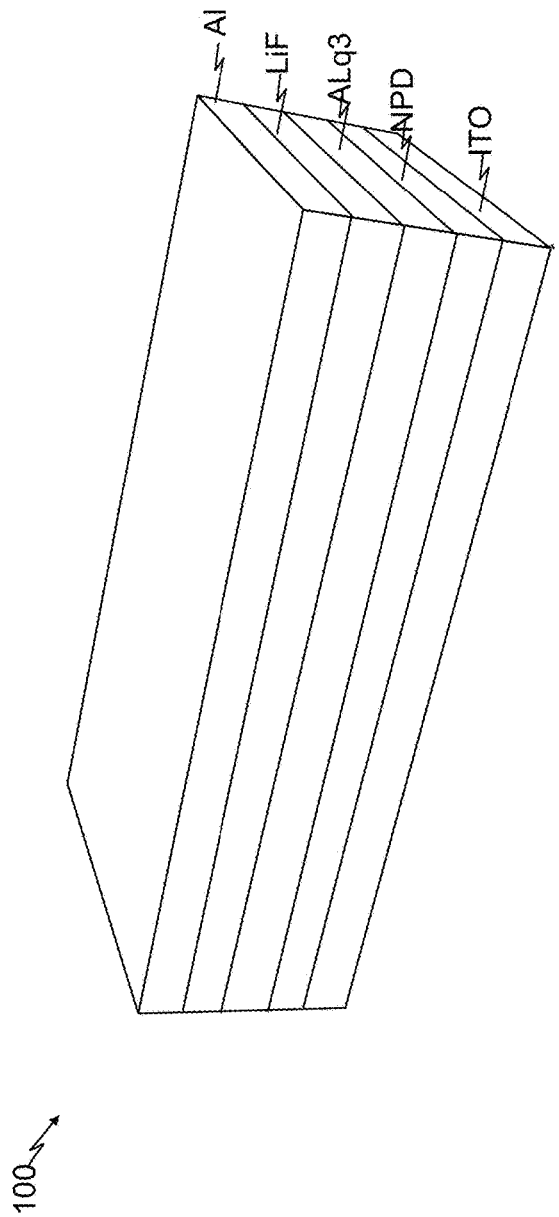
FIG. 1D depicts a perspective schematic diagram of an OLED structure.

One advantage of the combination of printed electronics and semiconducting single walled carbon nanotubes (SW-CNTs) is described herein for display electronics. In certain aspects, conductive silver ink and a 98% semiconductive SWCNT solution are used to print thin film transistors (TFTs) with high mobility, high on/off ratios and a high current carrying capacity. Combined with printed solid electrolyte (PEI with $LiCIO_4$) as the gating material, these top gated devices are suitable current switches for OLEOs. An OLED driving circuit including two top gated fully printed transistors has been fabricated and the successful control over OLEDs has been demonstrated. FIGS. 1C and 1D present an OLED structure 100 used herein: a N,N'-Di(1-naphthyl)-N,N'-diphenyl-(1,1'-biphenyl)-4,4'-diamine (NPD)/ Tris-(8-hydroxyquinoline)aluminum (Alq3) green light OLED with Indium tin oxide (ITO) and aluminum (Al)/Lithium Fluoride (LiF) as anode and cathode material, respectively. In addition, a CNT TFT inverter has been fabricated. Frequency operation of single top gated fully printed transistors indicates the transistors described herein to be a viable technology for backplane display applications.

An OLED control circuit with a 2T1C structure is described herein as an example having a good compromise between more complex device structures and the shortfalls of the less complex 1T1C control circuit. For simplicity and ease of demonstration, the 2T1C structure has been modified by removing the storage capacitor and fabricated 2T control circuit.

For OLEO based displays, driving current up to 1-5 µA/pixel is typically required for high resolution display. Commercial LED/OLEO-based displays adopt low temperature polysilicon (LTPS) TFT or amorphous silicon (α-Si) TFTs for compatibility with mainstream silicon fabrication processes. However, they require high-temperature processing and suffer from low mobility (e.g., <1 $V_s/cm^2$). Single-walled carbon nanotubes (SWCNTs) are ideal channel materials for TFTs due to their high mobility, high on/off ratio as well as small operation voltage. CNTs also allow for solution deposition fabrication routes. Due to the excellent current carrying capacity of SWCNTs, SWCNT TFTs can provide enough driving current for typical high-resolution OLEO displays with a much smaller channel length and width, as well as operation voltage. Such advantages allow dense integration of pixels, higher aperture ratios, and smaller power consumption without sacrifice of brightness, resolution and/or response time.

As described herein, 98% separated semiconducting SWCNTs and printed electronics are used in the fabrication of fully printed back gated SWCNT TFTs. In some implementations, the mobilities of back gated SWCNT TFTs fall in the range of 10-30 $cm^2/V_S$, with the highest reaching 34.2 $cm^2/V_S$. On/off ratio of the back gated devices varies between $10^4$~$10^7$ and the highest on/off ratio is 1.28× $10^7$. Based on the success of fully printed back gated devices, fabricated printed top gated SWCNT TFTs with printed PEI/$LiCIO_4$ as polymer electrolyte gating material were prepared. By varying PEI/$LiCIO_4$ coverage, the device behavior was tunable to either ambipolar or p-type. FIGS. 1G(1), 1G(2) and 1G(3) show photographic images of arrays of top gated CNT TFTs, a top gated CNT TFT and a zoomed-in image of the channel region, respectively. From the photo image in FIGS. 1G(1-3), only part of the channel is covered with PEI/$LiCIO_4$ and part of the channel is exposed to air. If the percentage of channel coverage is relatively small, the top gate device would remain p-type. If the coverage of PEI/$LiCIO_4$ is very high, then the device would display ambipolar behavior. A fully printed 2T single pixel OLEO control circuit has also been demonstrated (see e.g., FIG. 1G(4) and inset 1G(5)).

Figure 1E:
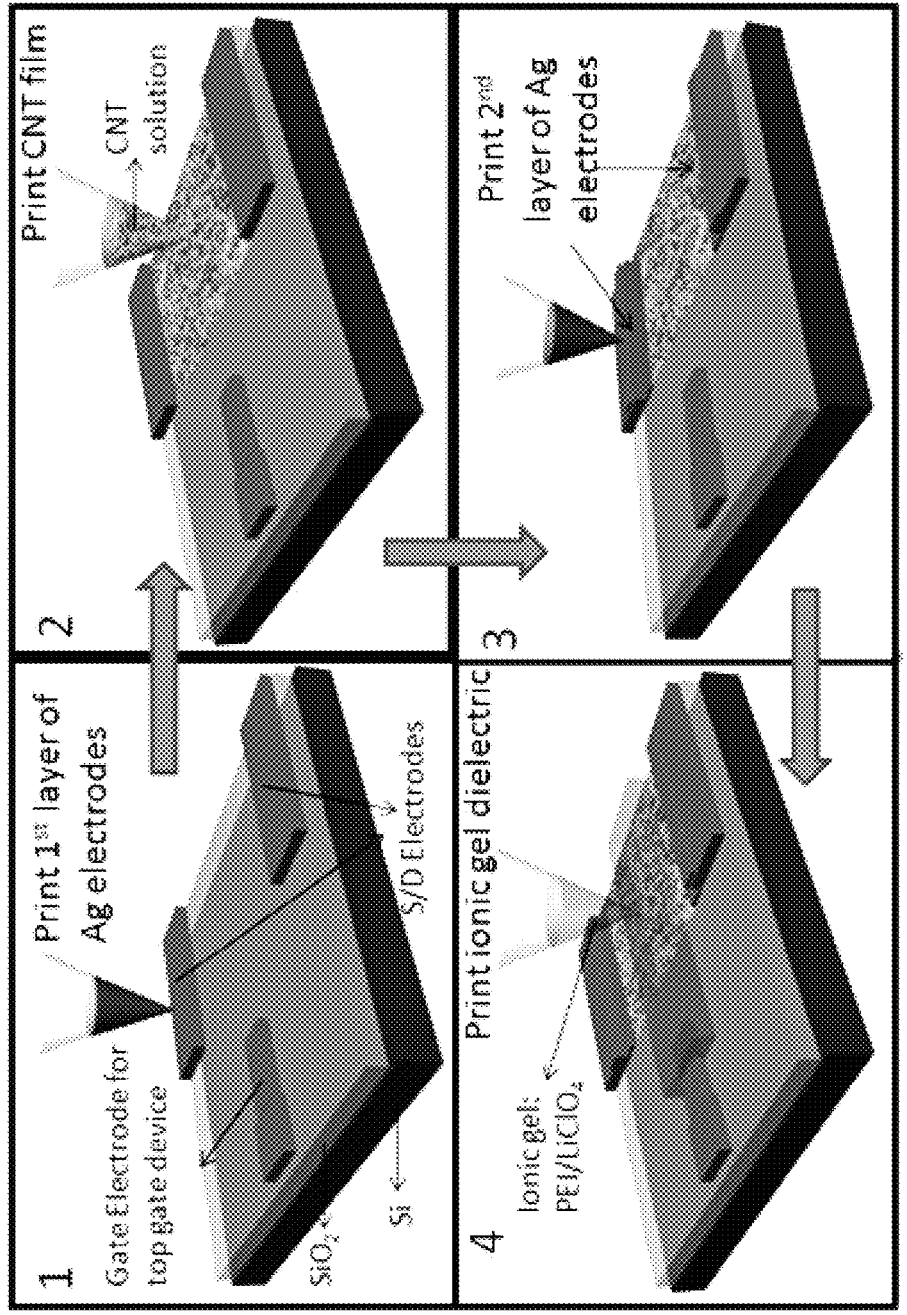
FIG. 1E presents a schematic diagram illustrating a fully printed top gated CNT TFT fabrication process.
Figure 1F:
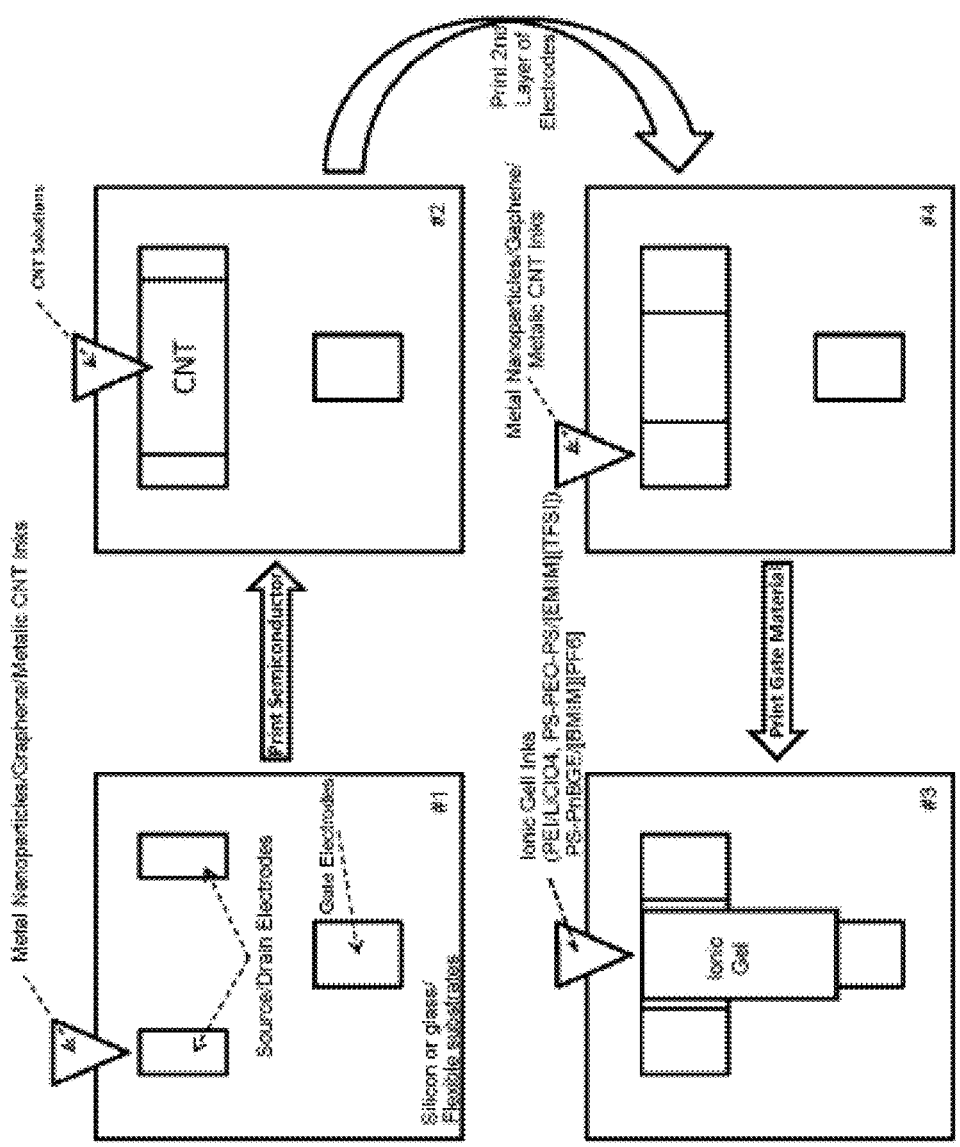
FIG. 1F depicts a schematic diagram of an example process for top gated CNT TFT fabrication printing, according to some aspects of the technology.
Figure 1G:
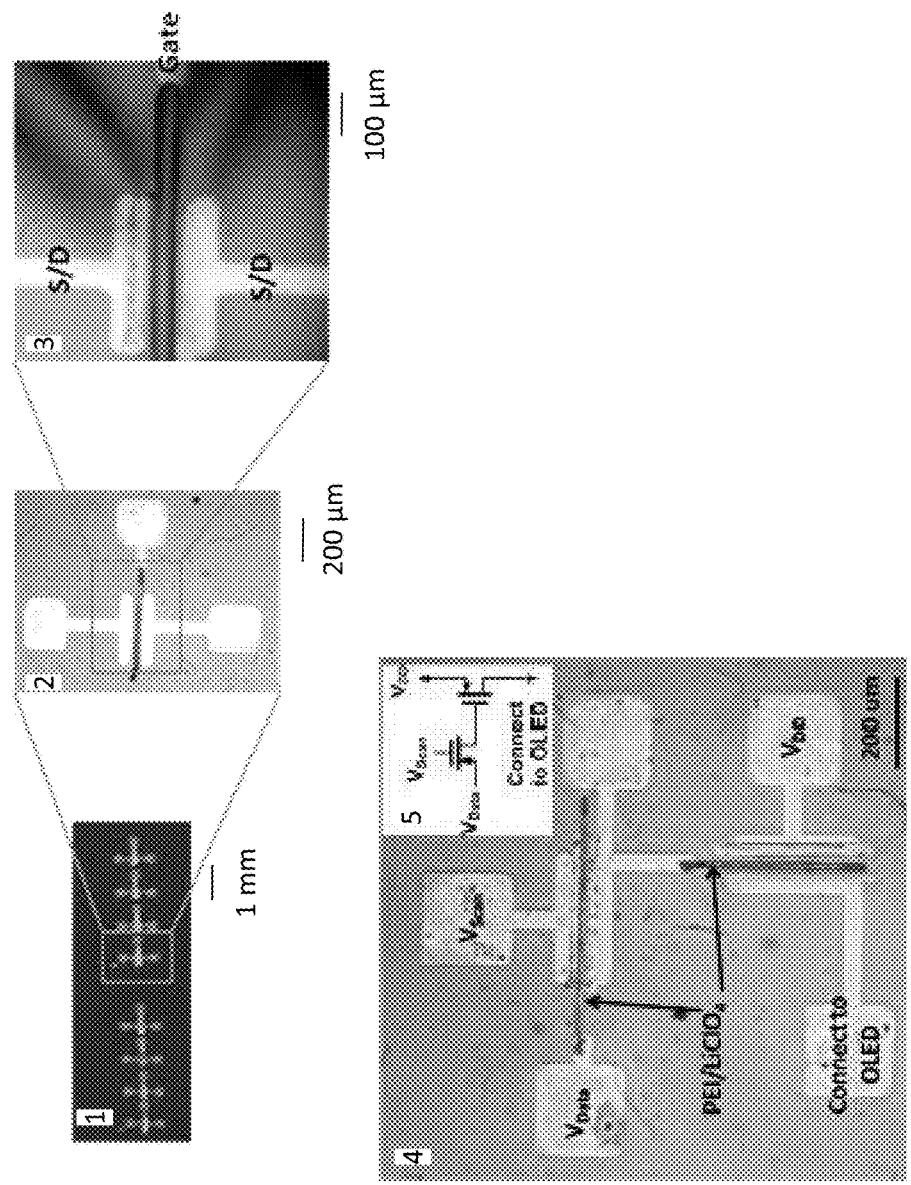
FIG. 1G depicts (1-3) photographic images of top gated fully printed CNT TFTs on Si/SiO$_2$ wafer and (4): a photographic image of one 2T OLED display control circuit, the inset schematic (5) showing the corresponding circuit diagram.

FIGS. 1E and 1F show the process of printing of both back gated and top gated SWCNT TFT on Si/$SiO_2$ wafer. Briefly, a commercial silver nanoparticles solution (Cabot Corp., CCI 300) is first printed to form source and drain electrodes, as well as gate pads to be used later for top gated TFT structures. A post sintering of the. silver electrodes at 180° C. was performed to achieve a small resistance (e.g., ~1Ω/sq), as was measured by Van Der Pauw method. To improve the adhesion of SWCNT to Si/$SiO_2$ wafers, the wafers were functionalized by diluted aminopropyltriethoxy silane (APTES) by methods generally known in the art, before printing of the 98% semiconductive SWCNT solution (Nanolntegris Inc.) as active channel material. Subsequently, the devices were rinsed with DI water after the printed SWCNT solution dried out to remove the sodium dodecyl sulfate (SDS) residue. After SEM inspection of the CNT film to confirm the uniformity and desired CNT density, another layer of silver electrodes was added along the border of silver and SWCNT film, to improve the contact between silver electrodes and SWCNT networks. Electric property measurements were performed to inspect the performance of these SWCNT TFTs before printing of ion gel dielectric. Finally, PEI/$LiCIO_4$ is printed as a top gate dielectric as well as gate electrode, expanding from the gate pad to the SWCNT film in the channel.

Uniformity and high density are two factors in the printed back gated TFTs. It also influences the success of turning a back gated TFT into a top gated TFT by adding a strip of ion gel dielectric. FIGS. 1G(1-3) shows details of the as printed back gated CNT TFT, especially the channel region.

In certain aspects, electric performance characterization can be carried out for the as-fabricated back gated devices. The W of the devices we studied approximately ranged from 100 µm to 500 µm, while L ranged from 10 µm to 200 µm. More accurate values of the W and L used in mobility derivation can be measured via FESEM. Most devices exhibit an $I_{on}$ of 1~10 µA (at drain voltage of 1.0 V and gate voltage of −20 V), $I_{on}/I_{off}$ ratio of $10^4$~$10^7$, mobility of 10~30 $cm^2/V_s$ and $V_{th}$ of −5.0 V. For example, FIGS. 2B-d illustrate example current-voltage characteristics (I-V) of one representative device with W =510.5 µm and L =88.8 µm.

One curve of transconductance versus gate voltage ($V_G$) is derived from and plotted together with the drain current Iso) versus gate voltage plot when drain voltage ($V_{SD}$) equals 1.0 V, as is shown in FIG. 2D. The $I_{DS}$-$V_{DS}$ family curves display clear linear region (FIG. 2A), indicating ohmic contacts formed between silver electrodes and CNT networks. Distinctive saturation behavior is observed when $V_D$ becomes more negative, as is shown in FIG. 2B. $I_D$-$V_G$ family curves measured in linear region (FIG. 2B) shows $I_{on}$ of 9.0 µA at Vo=0.8 V and $V_G$=-20 V, corresponding to a current density of 0.037 µA/µm. There is a clear cut off region and $I_{on}/I_{off}$ is $1.28 \times 10^7$.

Mobility can be calculated by:

$$\mu = \frac{L}{W} \frac{1}{C_{ox} V_D} \frac{dI_D}{dV_G},$$

where L and W are the device channel length and width, Vo=1V, Io-$V_G$ curve is measured at Vo=1V, and $C_{ox}$ is the gate capacitance per unit area. If the nanotube film is treated as a uniform and continuous film, a simple parallel model can be used to calculate $C_{ox}$:

$$C_{ox} = \frac{\varepsilon_0 \varepsilon_{ox}}{t_{ox}} = 6.90 \times 10^{-9} \ F/cm^2,$$

given that the dielectric is 500 nm $SiO_2$.

This results in a mobility of 23.1 $cm^2/V_s$. If the quantum capacitance of nanotube networks is taken, there is a more sophisticated and rigorous model to calculate $C_{ox}$, which gives:

$$C_{ox} = \frac{D}{\frac{1}{C_{QI}} + \frac{1}{2\pi\varepsilon_0\varepsilon_{ox}} \ln\left[\frac{\sinh(2\pi t_{ox} D)}{\pi R D}\right]},$$

where $C_{QI}$=$4 \times 10^{-10}$ F/m is the quantum capacitance of single nanotube and D≈28 tubes/µm is the nanotube density. This gives Cox=$6.74 \times 10^{-9}$ F/cm², which is similar to the Cox value based on the simple model. In some embodiments, this is the capacitance generated by 500 nm $SiO_2$, and is smaller than the quantum capacitance generated by nanotube networks. Since these two capacitances are in series, the smaller one should dominate. Hence the simple model for mobility calculation of all back gated CNT TFTs was adopted.

This study shows that back gated devices can have relatively uniform device performance, and tunable on current by designing proper W and L without compromising mobility and $I_{on}/I_{off}$. Overall, these as-printed CNT TFT devices show similar performance to their photolithography-made CNT TFT counterparts.

Based on the measured high $I_{on}$, high $I_{on}/I_{off}$ ratio, as well as high mobility of the printed CNT TFTs, their application in display electronics is further explored. In one example, an OLEO was connected to a typical SWCNT TFT back gated device. The schematic diagram is plotted in the inset of FIG. 2C. From the OLED current ($I_{OLED}$) versus $V_G$ family curves, e.g., see FIG. 2C, a close inspection of the curve measured at $V_{ss}$=-10V, when $V_G$=-10 V, reveals that the current flowing through the OLEO is 21.4 µA; when $V_G$=10 V, the current flowing through the OLED is 378.0 pA. This corresponds to a modulation of $I_{OLED}$ of 56614. From the $I_{OLED}$-Vss family curves (FIG. 2D), good diode behavior is observed with a clear cutoff region and triode region under different $V_G$, showing good control from the CNT TFT over the OLEO. The cutoff voltage of Vss is around -3.5 V, in accordance with the threshold voltage of the OLED.

From the figures, the SWCNT TFT was able to provide enough driving current (21.41 µA when $V_G$=-10 V and Vss=-10 V) for OLED, which requires as low as ~1 µA to have observable light emission. In certain aspects, the OLED can be on up to the point when Vo is as positive as 2 V, and is totally turned off when VG becomes more positive (6 V), corresponding to the $I_{OLEO}$-$V_G$ curve measured at $V_{ss}$=-10 V, where the curve enters cutoff region around 5.5 V.

The next step toward the 2T1C display control circuit is to fabricate top gate SWCNT TFTs based on printed back gated TFTs. Here PEI (Mw: 10 k, Sigma Aldrich) was used as an ion gel dielectric for CNT TFTs, due to its well known property that when applying a voltage to the surface of a thin film of this gel, the surface would become conductive and could work as a self-aligned gate electrode, while underneath this metallic layer, the gel would still remain insulating and work as a gate dielectric. Due to the large molecular weight, pure PEI has a high viscosity and therefore is unable to print out. Here PEI is dissolved in methanol in 1:5 volume ratio and stirred overnight to reduce the viscosity before printing. Besides, to improve the gate conductance, a small amount of $LiClO_4$ ($LiClO_4$ to PEI weight ratio: 1-2.5) is added to fine tune the device performance.

The printed top gated CNT TFTs were characterized by electric property measurements in ambient air. Interestingly, both ambipolar and p-type behaviors were observed for most devices. FIGS. 3A-B show the $I_D$-$V_G$ and $I_D$-$V_D$ family curves of a typical ambipolar device, while FIGS. 3C-D show that of a representative p-type device. The coverage of printed CNT TFT is seen to influence the change of type of carrier transport for devices with similar mobility before top gate electrolyte printing, which indicates similar CNT density and CNT/Ag source/drain pad contact condition. If the percentage of channel coverage is relatively small, the top gate device would remain p-type. If the coverage of PEI/$LiClO_4$ is very high, then the device would display ambipolar behavior. It has been reported that the carrier type in SWNTs can be modified by introducing electron donors or acceptors. For example, the electric properties shown in FIGS. 4A-B correspond to a PEI/$LiClO_4$ coverage of 85%, while the electric properties shown in FIGS. 4C-D correspond to a PEI/$LiClO_4$ coverage of 70%. The oxygen molecules adsorbed on CNT TFTs from air act as electron acceptors and therefore CNT TFTs are intrinsically p-type in ambient air.

Earlier studies of polymer electrolyte-gated CNT TFTs reveals that, the oxygen atoms in PEI/$LiClO_4$ would be adsorbed onto the SWNT sidewall and act as electron donors to compensate for the p-type doping effect from the oxygen molecules. It was also observed that if (2,3-dichloro-5,6-dicyanobenzoquinone) DDQ, a strong electron acceptor, was introduced into PEI, the polymer electrolyte-gated CNT TFT would become ambipolar at low DDQ concentration and return to p-type at a high DDQ concentration. A similar competition between oxygen atoms in PEI/$LiClO_4$ and oxygen molecules adsorbed onto CNT may be attributed to what is observed here. If the PEI/$LiClO_4$ coverage is 100%, then electron donors would dominate and the devices would assume exclusively n-type behavior. If the PEI/$LiClO_4$ coverage is very high, there are more electron donors than electron acceptors and thereby the CNT TFTs work as ambipolar top gated devices. If the PEI/LiClO$_4$ coverage is relatively low, there are more electron acceptors and the CNT TFTs remain p-type. However, the coverage of PEI/LiClO$_4$ may, beyond certain point, provide enough gating effect or the device would become very resistive after PEI printing.

Figure 4A:
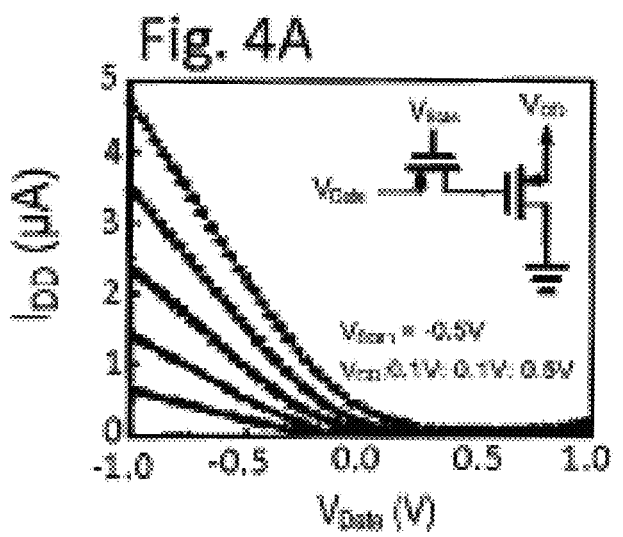
FIG. 4A illustrates an example characterization of a 2T control circuit, including $I_{DD}$-$V_{Data}$ family curves, according to some aspects of the technology.
Figure 4B:
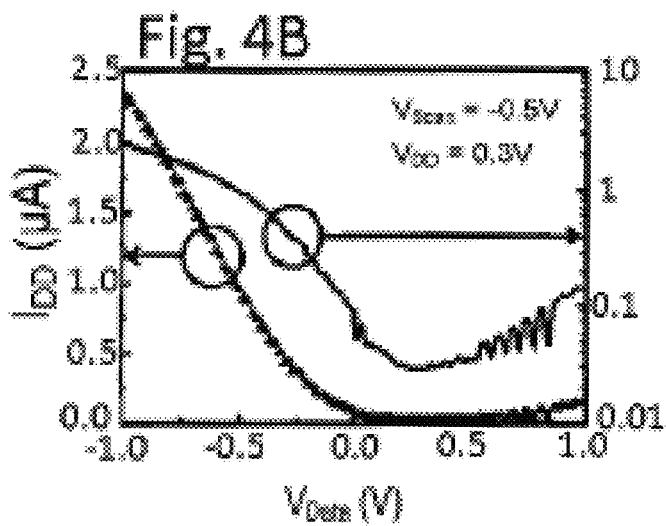
FIG. 4B illustrates an example $I_{DD}$-$V_{Data}$ curve in both linear plot and log plot, according to some aspects of the technology.
Figure 4C:
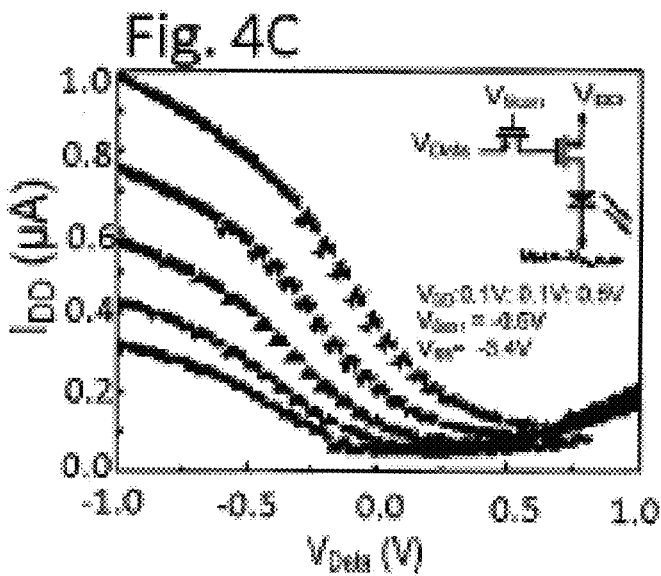
FIG. 4C illustrates an example characterization of a 2T control circuit connected to external an OLEO, including $I_{DD}$-$V_{Data}$ family curves according to some aspects of the technology.

From FIG. 3A, the subthreshold swings of ambipolar top gated device are calculated to be 258 mV/decade for p-type branch and 136 mV/decade for n-type branch, while that of the p-type top gated device is calculated to be 133 mV/decade, as is obtained from FIG. 4C. The above calculated subthreshold swings are of the same magnitude, as can be expected for devices with a similar ratio of diffusion capacitance and gate capacitance. Mobility calculations for polymer gated devices requires more analysis of total gate capacitance. The capacitance provided by PEI/LiClO$_4$ polymer is:

$$C_{PG} = \frac{\varepsilon \varepsilon_0}{\lambda}$$

Where λ is the Debye length calculated by:

$$\lambda = \sqrt{\frac{\varepsilon \varepsilon_0 kT}{2\rho e^2}}.$$

Here, p is the concentration of LiClO$_4$, ∈=10 is the dielectric constant of PEI. The calculated value for $C_{PG}$ is 2.062×10$^{-3}$ F/cm$^2$. Quantum capacitance generated by carbon nanotube network is quantified by:

$$C_Q = C_{Qi} \times i \; D = 1.12 \times 10^{-6} F/cm^2.$$

For nanotubes gated by PEI/LiClO$_4$, the nanotube capacitance and the polymer gate capacitance would be in series, and thereby the nanotube capacitance would dominate, which is almost 10$^3$ times smaller than that of PEI/LiClO$_4$. Based on this, the calculated mobility for holes of the ambipolar top gated transistor is about 0.42 CM$^2$/Vs and the calculated mobility for electrons is about 0.56 cm$^2$/Vs, while the calculated mobility for holes of the p-type top gated transistor is about 2.80 cm$^2$/Vs. Compared to the back-gated devices, the polymer gated transistors have a much lower mobility. This is not surprising as there would be more scattering at nanotube/polymer gate interface, which impedes carrier transportation. Noticeably, the mobility of the ambipolar device is much lower than that of the p-type top gated device. From the previous energy band analysis, it is indicated that ambipolar top gated transistors would have a lower on current compared to either n-type or p-type top gated transistors with same W and L, as their Schottky barrier for both holes and electrons are relatively thicker than that of their unipolar counterparts. Thereby, ambipolar devices would have a lower mobility.

Top gated CNT TFTs were printed on Kapton to demonstrate fully printed flexible devices. Electric property measurements of devices on Kapton and Si/SiO$_2$ show no significant differences compared to Si substrates, indicating no selectivity over substrates of these fully printed top gated CNT TFTs.

The hysteresis of all the devices mentioned above was compared: back gated device on silicon wafer, top gated ambipolar device on Kapton or silicon wafer, and top gated p-type device on silicon wafer. Hysteresis of top gated devices can be small, compared to that of the back gated devices, due, for example, to stronger gating effects from polymer electrolytes. Although there is a small amount of hysteresis, these devices were good enough for a simple logic circuit. A simple inverter function was demonstrated by using two ambipolar transistors.

The study of how the PEI/LiClO$_4$ operates as a dielectric and gate electrode for CNT TFTs paves the way for the 2T1C OLEO control circuit. For demonstration purpose, the storage capacitance was omitted and the transistor-only (2T) OLEO control circuit was tested. As p-type top gated CNT TFT has a higher mobility, and unipolar transportation ensures a symmetric cut off and turn on region, a p-type top gated CNT TFT for this circuit was utilized.

Electric property characterizations were done first without the OLEO, as is indicated in the circuit diagram shown on the inset of FIG. 4A. With $V_{DD}$ biased at 0.1 V, 0.2 V, 0.3 V, 0.4 V and 0.5 V and $V_{Data}$ swept from −1 V to 1 V, when $V_{Scan}$=0 V, the switch transistor is cut off and there is no current through the driving transistor. When $V_{Scan}$ =−0.5 V, the switch transistor turns on and It passes $V_{Data}$ to the driving transistor. The details of how $V_{Data}$ controls the current provided by driving transistor ($I_{DD}$) are plotted in FIG. 4A, under different $V_{DD}$ ranging from 0.5 V to 0.1 V. Specifically, the $I_{DD}$-$V_{Data}$ curve measured under $V_{DD}$=0.3 V is magnified and re-plotted in FIG. 4B.

Then an external OLEO is directly connected to this display circuit, with cathode connected to the drain of driving transistor and anode connected to a negative voltage of −3.4V, which is used to provide the voltage drop on OLEO in on state. $I_{DD}$-$V_{Data}$ was measured at $V_{DD}$=0.1 V, 0.2 V, 0.3 V, 0.4 V and 0.5 V. Noticeably, the on/off ratio decreased to about 10 due to the fact that in this circuit configuration the OLEO is never turned off due to the negative voltage applied to $V_{SS}$, the absolute value of which approximately equals the threshold voltage of OLEO. Yet the light intensity difference is still observed for the controlled OLEO.

Display applications typically operate at 60 Hz. Accordingly, frequency investigation of single top gated and back-gated transistors was conducted. The external OLEO was replaced with a resistance and found out the 3 dB frequency to be 5.66 kHz for back-gated CNT TFT and 93.3 Hz for top gated CNT TFT.

In summary, fully printed CNT TFT circuits based on 98% semiconducting SWCNT and printed electronic technologies have been fabricated. These CNT TFTs have good mobility, good on/off ratio and good current capacity. They are suitable components for OLEO-based display backplane electronics and the control over external OLEO using one single backgate CNT TFT is achieved. Based on that, with one more printing step of PEI/LiClO4, these back gated CNT TFTs are converted to top gated CNT TFTs. Top gated CNT TFTs are also made on Kapton to demonstrate the potential of using this technology for flexible electronics. Good CNT inverter functionality and transistor frequency characteristics were observed. Finally, 2T OLEO control circuit composed of two fully printed top gated CNT TFTs is made and its ability to control over external OLEO is demonstrated.

It Is understood that any specific order or hierarchy of steps In the processes disclosed is an illustration of exemplary approaches. Based upon design preferences, it Is understood that the specific order or hierarchy of steps In the processes may be rearranged, or that all illustrated steps be performed. Some of the steps may be performed simultaneously. For example, In certain circumstances, multitasking and parallel processing may be advantageous. Moreover, the separation of various system components in the embodiments described above should not be understood as requiring such separation In all embodiments, and it should be understood that the described program components and systems can generally pe integrated together In a single software product or packaged Into multiple software products.

The previous description Is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

The invention claimed is:

1. A method comprising:
   forming a p-type top gated thin film transistor, including:
      printing a first electrically conductive material on a substrate to form source, drain and gate pad electrode layers;
      printing a film including carbon nanotubes on the substrate between the source electrode layer and the drain electrode layer, thereby defining a printed p-type channel region having a length that extends from the source electrode layer to the drain electrode layer;
      printing a second electrically conductive material along a border between the source electrode layer and one end of the printed p-type channel region and a border between the drain electrode layer and an opposite end of the channel region; and
      printing an ionic gel layer, wherein:
         the printed ionic gel layer partially covers a portion of an exposed part of the printed p-type channel region not covered by the second electrically conductive material and a remaining portion of the exposed part of the printed p-typechannel region remains exposed,
         the printed ionic gel layer extends to contact the gate pad, and
         the partially covered printed p-type channel region retains p-type behavior.

2. The method of claim 1, wherein the first electrically conductive material, the second electrically conductive material, or both comprise silver.

3. The method of claim 1, wherein the carbon nanotubes comprise semiconducting single-walled carbon nanotubes.

4. The method of claim 1, wherein the carbon nanotubes consist essentially of single-walled carbon nanotubes.

5. The method of claim 1, wherein a bottom surface of the ionic gel layer is a gate dielectric layer, and, a top surface of the ionic gel layer, when a voltage is applied to the top surface, is a conductive gate electrode.

6. The method of claim 1, wherein 70 percent or less of the partially covered channel region is covered with the printed ionic gel layer.

7. The method of claim 1, wherein the ionic gel layer comprises a polymer electrolyte.

8. The method of claim 1, wherein the ionic gel layer comprises polethylenimine and $LiClO_4$.

9. The method of claim 1, wherein substrate comprises a $Si/SiO_2$ wafer.

10. The method of claim 1, comprising sintering the first layer of electrodes before printing the carbon nanotube film on the substrate.

11. The method of claim 1, comprising contacting the substrate with (aminopropyl) triethoxysilane before printing the carbon nanotube film on the substrate.

12. The method of claim 1, further including forming an organic light emitting diode driving circuit including:
   forming a second one of the p-type top gated thin film transistor on the substrate: and
   electrically connecting the printed drain electrode laver of the second p-type top gated thin film transistor to the printed ionic gel dielectric layer of the p-type top gated thin film transistor.

13. The method of claim 1, further including forming an organic light emitting diode circuit including electrically connecting the drain electrode of the p-type top gated thin film transistor to a cathode of an OLED structure of the circuit.

14. A p-type top gated thin film transistor comprising:
   a substrate;
   a printed source electrode layer, a printed drain electrode layer and a printed gate pad layer,
   wherein the printed source, drain and gate pad layers are located on the substrate and are composed of a first electrically conductive material;
   a printed p-type channel region composed of a single-walled carbon nanotube film located on the substrate between the source electrode layer and the drain electrode layer, the p-type channel region having a length that extends from the source electrode layer to the drain electrode;
   a printed second layer of electrically conductive material located along a border between the source electrode layer and one end of the printed p-type channel region and a border between the drain electrode layer and an opposite end of the channel region; and a printed ionic gel layer, wherein:

the printed ionic gel partially covers a portion of an exposed part of the printed p-type channel region not covered by the second electrically conductive material and a remaining portion of the exposed part of the printed p-type channel region remains exposed, the printed ionic gel layer extends to contact the gate pad, and the partially covered printed p-type channel region retains p-type behavior.

15. The transistor of claim 14, wherein the p-type top gated thin film transistor is part of an organic light emitting diode circuit, the drain electrode of the p-type top gated thin film transistor electrically connected to a cathode of an OLED structure of the circuit.

16. An organic light emitting diode driving circuit, comprising:

a substrate;

a p-type top gated thin film transistor, the transistor including:

a printed source electrode layer, a printed drain electrode layer and a printed gate pad layer, wherein the printed source, drain and gate pad layers are located on the substrate and are composed of a first electrically conductive material;

a printed p-type channel region composed of a single-walled carbon nanotube film located on the substrate between the source electrode layer and the drain electrode layer, the p-type channel region having a length that extends from the source electrode layer to the drain electrode layer;

a printed second layer of electrically conductive material located along a border between the source electrode layer and one end of the printed p-type channel region and a border between the drain electrode layer and an opposite end of the channel region; and a printed ionic gel layer wherein:

the printed ionic gel partially covers a portion of an exposed part of the printed p-type channel region not covered by the second electrically conductive material and a remaining portion of the exposed part of the printed p-typechannel region remains exposed, the printed ionic gel layer extends to contact the gate pad, and the partially covered printed p-type channel region retains p-type behavior.

17. The driving circuit of claim 16, further including:

a p-type top gated thin film transistor, wherein the printed drain electrode layer of the second p-type top gated thin film transistor is electrically connected to the printed ionic gel dielectric layer of the p-type top gated thin film transistor.

* * * * *